United States Patent
Matz et al.

[11] Patent Number: 6,067,312
[45] Date of Patent: May 23, 2000

[54] METHOD FOR PRODUCTION OF A DFB LASER DIODE HAVING A COUPLED OPTICAL WAVEGUIDE AND A DFB LASER DIODE LAYER STRUCTURE

[75] Inventors: Richard Matz, Bruckmühl; Bernhard Stegmüller, Augsburg, both of Germany

[73] Assignee: Siemens Aktiengesellschaft, Munich, Germany

[21] Appl. No.: 08/952,414

[22] PCT Filed: May 3, 1996

[86] PCT No.: PCT/DE96/00781

§ 371 Date: Nov. 18, 1997

§ 102(e) Date: Nov. 18, 1997

[87] PCT Pub. No.: WO96/37020

PCT Pub. Date: Nov. 21, 1996

[30] Foreign Application Priority Data

May 18, 1995 [DE] Germany .......................... 195 18 350

[51] Int. Cl.[7] .............................. H01S 3/08; H01S 3/085
[52] U.S. Cl. .............................. 372/96; 372/50; 372/45; 372/43; 438/32
[58] Field of Search .................................. 372/96, 50, 45, 372/43; 438/32

[56] References Cited

U.S. PATENT DOCUMENTS

| | | | |
|---|---|---|---|
| 5,020,072 | 5/1991 | Abe et al. | 372/96 |
| 5,358,898 | 10/1994 | Ogita et al. | 438/32 |
| 5,539,766 | 7/1996 | Ishino et al. | 372/96 |

FOREIGN PATENT DOCUMENTS

| | | |
|---|---|---|
| 0 454 902 A2 | 6/1991 | European Pat. Off. . |
| 2 647 276 | 11/1990 | France . |
| 44 04 756 A1 | 8/1995 | Germany . |

OTHER PUBLICATIONS

Electronics Letters, vol. 28, No. 25, Dec. 3, 1992, Monolithic Integration of Multiwavelength Compressive–Strained Multiquantum–Well Distributed–Feedback Laser Array with Star Coupler and Optical Amplifiers, pp. 2361–2362.

Electronics Letters, vol. 26, No. 2, Jan. 18, 1990, High Performance Buried Ridge DFB Lasers Monolithically Integrated with Butt Coupled Strip Loaded Passive Waveguides for OEIC, pp. 142–143.

Applied Physics Letters, vol. 54, No. 2, Jan. 9, 1989, K. Y. Liou et al, Monolithic Integrated InGaAsP/InP Distributed Feedback Laser with Y–Branching Waveguide and a Monitoring Photodetector Grown by Metalorganic Chemical Vapor Deposition, pp. 114–116.

Patent Abstracts of Japan, vol. 009, No. 230, (E–343), Sep. 17, 1985, & JP A 60–084892 dated May 14, 1985.

Electronics Letters, vol. 29, No. 19, Sep. 16, 1993, B. Stegmüller et al, High–Temperature (130° C.) CW Operation of 1.53μm, InGaAsP Ridge–Waveguide Lasers Using Strained Quaternary Quantum Wells, pp. 1691–1693.

Published by Siemens Semiconductor Group, No. B155–H6656–X–X–7400, (1993), Module for Bidirectional Optical Transmission, pp. 2–7. (no month available).

*Primary Examiner*—Rodney Bovernick
*Assistant Examiner*—Sung T. Kim
*Attorney, Agent, or Firm*—Hill & Simpson

[57] ABSTRACT

Use of the method allows MRCW high-temperature laser diodes with a coupled optical waveguide to be produced in four epitaxial steps. The advantage is that, of the four epitaxial processes the first two and the last two are carried out virtually immediately successively after one another and an interruption is necessary only to produce a grating. Other components, such as photodiodes for example, can also be produced using the method.

12 Claims, 4 Drawing Sheets

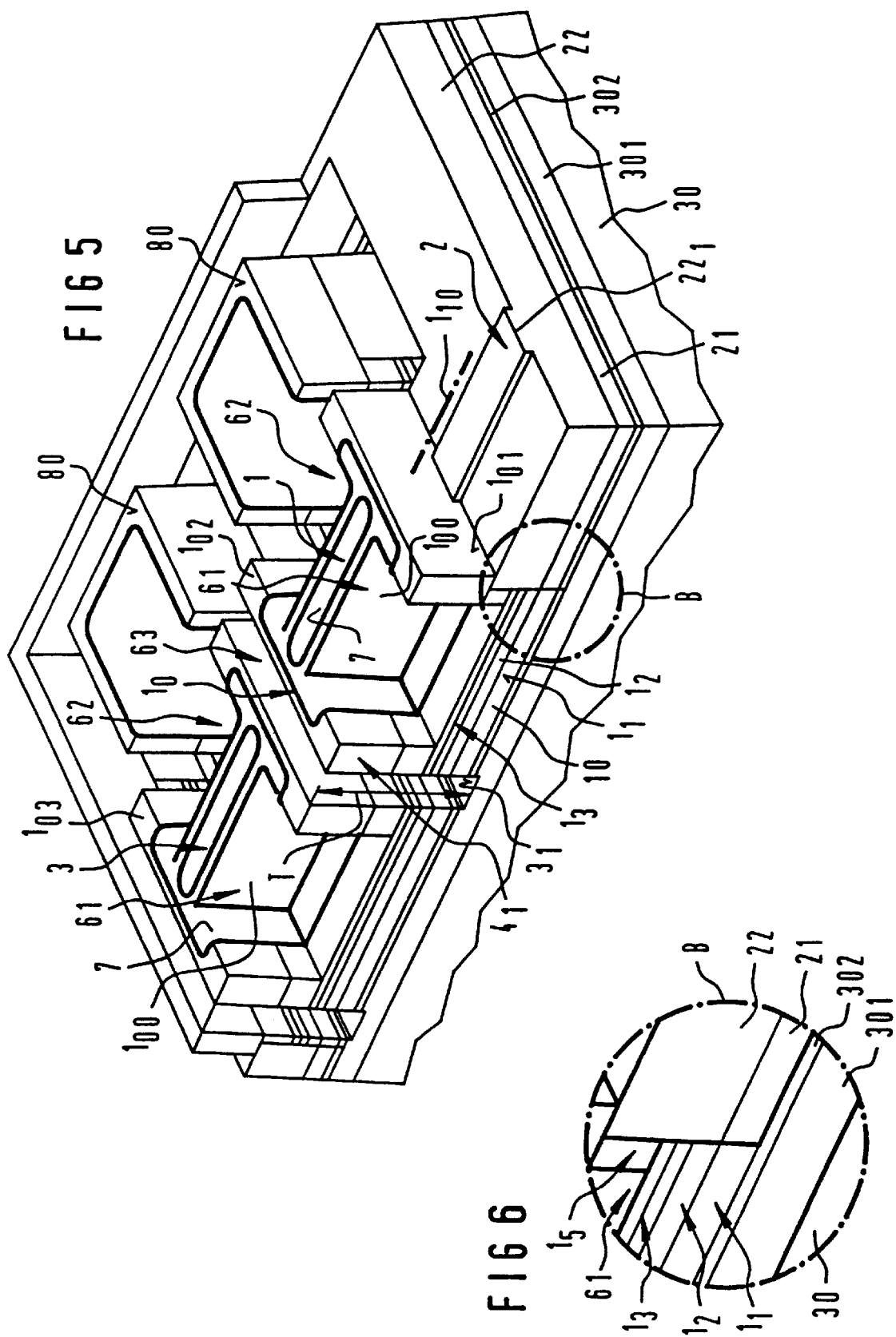

METHOD FOR PRODUCTION OF A DFB LASER DIODE HAVING A COUPLED OPTICAL WAVEGUIDE AND A DFB LASER DIODE LAYER STRUCTURE

BACKGROUND OF THE INVENTION

Method for production of a DFB laser diode having a coupled optical waveguide and a DFB laser diode layer structure.

The invention relates to a method for production of a MCRW-DFB laser diode with a coupled optical waveguide and a MCRW-DFB laser diode layer structure.

Optical data transmission has now gained considerable importance in long-distance traffic, but it is still not very widespread in the subscriber connection area, for cost reasons. In order to give the network subscriber access to distributive and interactive services and to the corresponding unidirectional and bidirectional data streams via his connection, the connection modules used here contain as primary functions the transmitter in the form of a semiconductor laser and the receiver in the form of a photodiode. A monitoring diode for monitoring the transmitting laser and wavelength-selective filter are added thereto as a secondary function in order to suppress crosstalk by separation of the different transmitted and received wavelengths. In order to service the demand for large quantities, which can be expected on the basis of system aspects, these modules must be produced cost-effectively.

Commercial transmitting/receiving modules having the four described functions of a laser diode, monitoring diode, receiver diode and filter are produced using microoptic construction techniques in accordance with the current prior art (see the publication "BIDI Bidirectional Modules" No. B155-H6656-X-X-7400 (1993) from Siemens AG). In this case, the large number of individual parts leads to relatively labour-cost-intensive assembly and adjustment steps. In the context of this technology, there are a number of options for further cost reduction, for example by using prefabricated subunits, for example a fibre-lens unit, a laser-monitor unit, inter alia, by development of a more economic construction technique while increasing quality, yield and life of the discrete module components. An example of this is the transition from the MCRW laser (MCRW stands for metal clad ridge waveguide) having a homogeneous laser-active layer to the MCRW laser having a strained quantum well structure (SL-MQW structure, where SL-MQW stands for strained layer multiple quantum well). In addition to the known advantages of the MCRW structure, which are a single epitaxial process, low leakage current and long life, this laser additionally offers a low threshold and a high maximum operating temperature, so that a high-temperature laser is produced. The characteristics of an MCRW laser for 1.3 $\mu$m are described in detail in B. Stegmuller, E. Veuhoff, J. Rieger and H. Hedrich "High-temperature (130° C.) CW operation of 1.53 $\mu$m InGaAsP ridge-waveguide lasers using strained quaternary quantum wells", Electronics Letter, Vol. 29 (1993), No. 19, pages 1691–1693.

In the relatively old German Patent Application 20 P 44 04 756.8, the monolithic integration of the four functions on a substrate made of semiconductor material, for example InP, is proposed. Planar technologies are used for this purpose, as have been proven for the production of silicon chips. The photonic integration on InP in this case, in detail, makes use of technologies which are now largely prior art for discrete InP components. This includes epitaxial processes, lithography, etching techniques etc. Adjustment processes between microoptic parts have been replaced by photolithographically defined component structures. Standardization of the technology is leading to identical, interchangeable installations and process steps. The number of parts in the module, which is reduced by monolithic integration, reduces assembly times and improves the robustness. A method for production of a DFB laser diode (DFB stands for distributed feedback) and a DFB laser diode layer structure produced in accordance with this method are proposed in specific form in this document.

European reference-A-0 454 902 discloses a monolithically integrated circuit that comprises, among other things, a MCRW-DFB laser diode structure with butt-coupled waveguide and also discloses a 4-step epitaxy method for the manufacture thereof. The laser diode comprises a solid quaternary active layer. The DFB grating structure is arranged under the active layer.

A compressively strained MQW-DFB laser diode having a monolithically integrated waveguide, which is continuous, as well as a two-layer grating structure arranged above the active layer proceeds from Electronics Letters 28 (1992), p. 2361.

SUMMARY OF THE INVENTION

Using the method according to the invention, is possible to produce in an advantageous manner a monolithically integrated MCRW DFB high-temperature laser diode with a coupled optical waveguide, the advantage furthermore existing that the performance and cost advantages of this laser type are linked to the advantages of monolithic integration for modules having a transmitting function, that is to say in particular bidirectional modules as well, by the method according to the invention.

A further advantage of the method according to the invention is that, of the four epitaxial processes, the first and second and the third and fourth are each carried out immediately successively and that an interruption occurs only as a result of the grating production. Since the substrate has to be removed from the epitaxy installation only briefly for an etching step, for example in an HF bath, there is virtually a single epitaxial process. In addition, there is the advantage that a ternary receiver photodiode can additionally be integrated on the waveguide, in a similar manner to that in the case of the method according to the relatively old patent application, which has been referred to in more detail above. The associated component layers can be grown, structured and, during the subsequent epitaxial step which has to be carried out selectively in this case, be overgrown as far as the flat surface, in a similar manner to that in the relatively old patent application for the epitaxy step for production of the waveguide. All the other method steps are identical to those in the version without a receiver photodiode.

The present invention is a method for production of an arrangement composed of a MCRW-DFB laser diode and an optical waveguide, which is optically coupled to the laser diode, there being produced on the surface of a substrate of n$^+$-doped InP in a first epitaxial step, a buffer layer of n-doped InP, a first etch stop layer of quaternary material, a first layer stack which is composed of at least one layer made of n-doped InP, a laser-active layer which is composed of two or more compressively strained quantum well layers made of a quaternary material and of one or more barrier layers located between the quantum well layers and made of a quaternary material, on the first layer stack and a second layer stack on the laser-active layer. The second layer stack is at least composed of a layer of p-doped InP arranged on the laser-active layer, of layer of p-doped quaternary material arranged on this layer, and of a layer of p-doped InP arranged on this layer and has a surface facing away from the laser-active layer, whereby an optical grating is produced in the form of a relief in the surface of the second layer stack. In a second epitaxial step a third layer stack is produced on the surface of the second layer stack containing the grating. The third layer stack is composed of a layer of p-doped InP or of ternary material that covers the grating. A second etch stop layer of p-doped quaternary material is arranged on this layer and of a layer of p-doped InP arranged on this layer. The second layer stack, the laser-active layer and the first layer stack are removed in areas down to the first etch stop layer, so that a raised region which is composed of the first layer stack, the laser-active layer and the second layer stack. An end face at an angle to the first etch stop layer remains on this etch stop layer, and a region of the first etch stop layer that adjoins the end face of the raised region is uncovered alongside this raised region. In a third epitaxial step a fourth layer stack is produced selectively on the exposed region of the first etch stop layer but not on the raised region. The fourth layer stack defines the waveguide and is composed of first and second optical outer layers and an optically conductive layer of quaternary material located between these outer layers. The optically conductive layer lies at the level of the laser-active layer with respect to the first etch stop layer and has an end face lying opposite the end face of the raised region. In a fourth epitaxial step a fifth layer stack is produced on the raised region and the fourth layer stack. The fifth layer stack is composed of a layer of p-doped InP and of a contact layer of p-doped InGaAs arranged on this layer for the application of an electrical contact.

Advantageous developments of the present invention are as follows.

Two depressions are produced in the remaining raised region, which depressions extend in depth as far as the second etch stop layer, are separated from one another by a ridge that is composed of layers of the raised region that remain between the depressions above the second etch stop layer and that has a longitudinal axis that is essentially perpendicular to the end face of the raised region, and extend into the vicinity of this end face.

A separating trench is produced in the remaining raised region, which separating trench extends essentially parallel to the end face of the raised region and extends in depth to the first etch stop layer and divides the raised region into two parts which are separated from one another.

Those layers which are located above the optically conductive layer is removed in the fourth layer stack and at least one ridge is produced in the exposed surface of the optically conductive layer.

A laser-active layer is produced, the quantum well layers and barrier layers thereof being arranged at least between two layers of a quaternary material having a lower gap wavelength compared to the quantum well layers.

A second stack layer is produced on the laser-active layer, whereby a further layer of p-doped InP or of ternary material is arranged on the layer of p-doped InP or of ternary material arranged on the layer of p-doped quaternary material, that surface of the further layer facing away from the laser-active layer forming the surface of the second layer stack.

The present invention is also an arrangement composed of an MCRW-DFB high-temperature laser diode and an optical waveguide optically coupled to the laser diode, a buffer layer of n-doped InP and, on the buffer layer, a first etch stop layer of n-doped quaternary material on the surface of a substrate of $n^+$-doped InP. A raised, first layer sequence is provided for the laser diode and a second layer sequence is provided for the waveguide. The layer sequences are arranged next to one another and are fashioned on the first etch stop layer. The first layer sequence is at least composed of a layer of n-doped InP, a laser-active layer arranged on this layer and has two or more compressively strained quantum well layers of quaternary material and one or more barrier layers of a quaternary material that lie between the quantum well layers. A layer of p-doped InP is arranged on the laser-active layer. A layer of p-doped quaternary material is arranged on this layer. A layer of p-doped InP or ternary material is arranged on this layer and has a surface facing away from the laser-active layer. An optical grating is fashioned in the form of a relief in the surface. A layer of p-doped InP covers the grating. A second etch stop layer of p-doped quaternary material is arranged on this layer. A layer of p-doped InP is arranged on this layer. The second layer sequence is composed of a first and second optical cladding layer of InP, as well as a waveguiding layer of quaternary material lying between these cladding layers. The laser-active layer and the waveguiding layer lie at the same height with reference to the first etch stop layer and adjoin one another in end faces lying opposite one another that reside at an angle relative to the first etch stop layer. A layer of p-doped InP and a contact layer of p-doped InGaAs are arranged on the layer for the application of an electrical contact and are fashioned on the two raised layer sequences.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 5 shows a perspective illustration of the design of a complete arrangement which has been produced in accordance with the method according to the invention and comprises a DFB laser diode with a coupled waveguide, FIG. 6 shows an enlarged illustration of the detail designated B in FIG. 5, in order to illustrate more clearly the coupling point at which the laser diode and the waveguide are coupled to one another.

DESCRIPTION OF THE PREFERRED EMBODIMENTS

Figure 2:
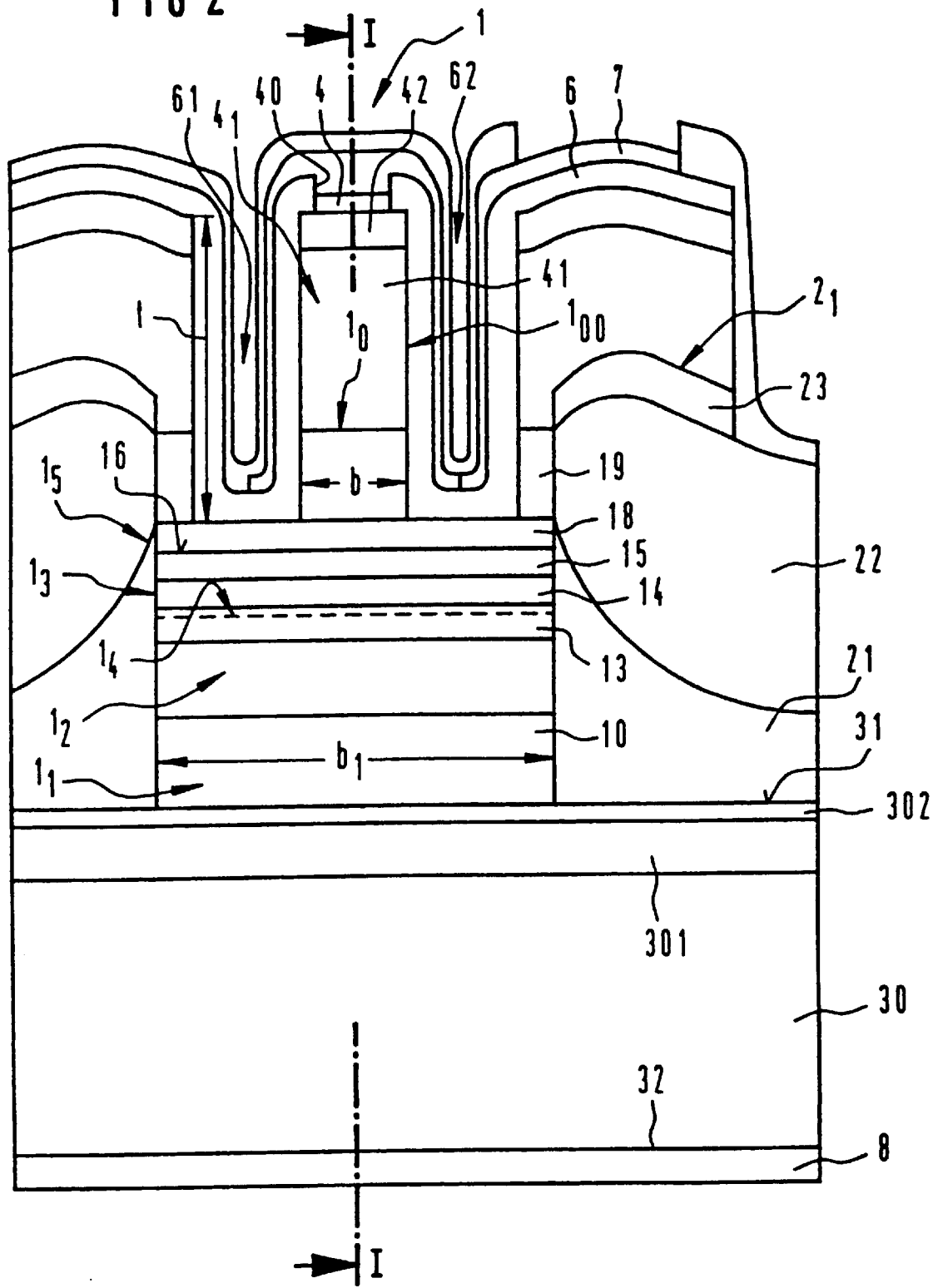
FIG. 2 shows a cross-section, on the section line II—II in FIG. 1, through this DFB laser diode.
Figure 3:
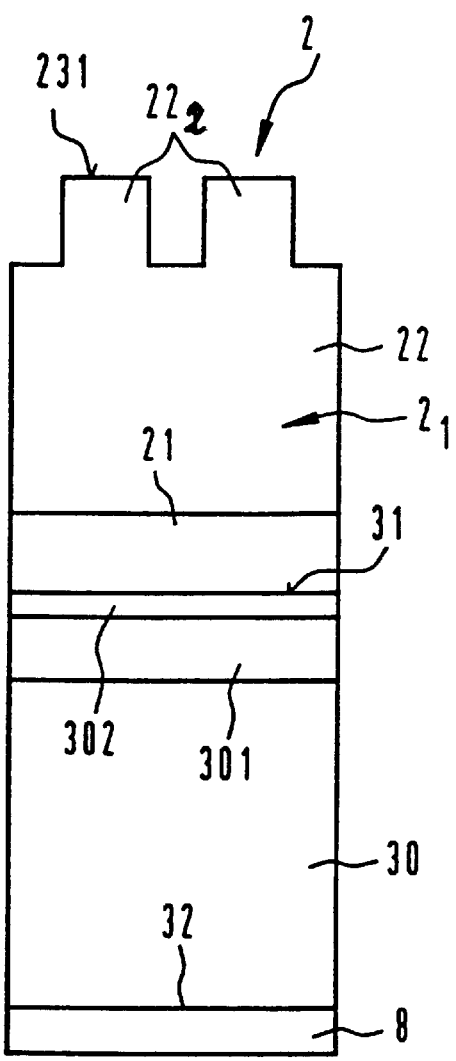
FIG. 3 shows a cross-section, on the section line III—III in FIG. 1, through the structured waveguide.

The method according to the invention will be described first with reference to FIGS. 1 to 3.

Figure 4:
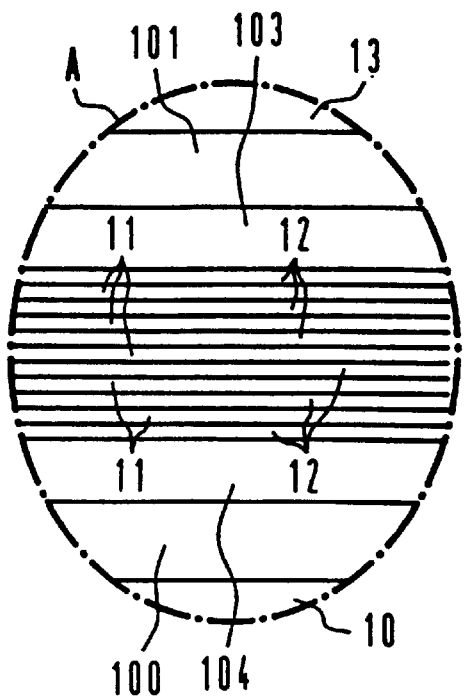
FIG. 4 shows an enlarged illustration of the detail, which is designated A in FIG. 1, from the laser-active layer of the laser diode according to the invention, in order to make the quantum well layers and barrier layers more clearly visible.

There are produced on the surface 31 of a substrate 30 made of semiconductor material of a specific conductance type, for example n-doped semiconductor material, in a first epitaxial step a first layer stack $1_1$ which is composed of at least one layer 10 made of semiconductor material of the specific conductance type n, a laser-active layer $1_2$, which is composed of two or more compressively strained quantum well layers 11 (see FIG. 4) made of a quaternary material and of one or more barrier layers 12 located between the quantum well layers 11 and made of a quaternary material, on this first layer stack $1_1$, and a second layer stack $1_3$, which is composed of two or more layers 13, 14, 15 made of semiconductor material of the opposite conductance type p to the specific conductance type n and has a surface 16 facing away from the laser-active layer $1_2$, on this laser-active layer $1_2$.

Figure 1:
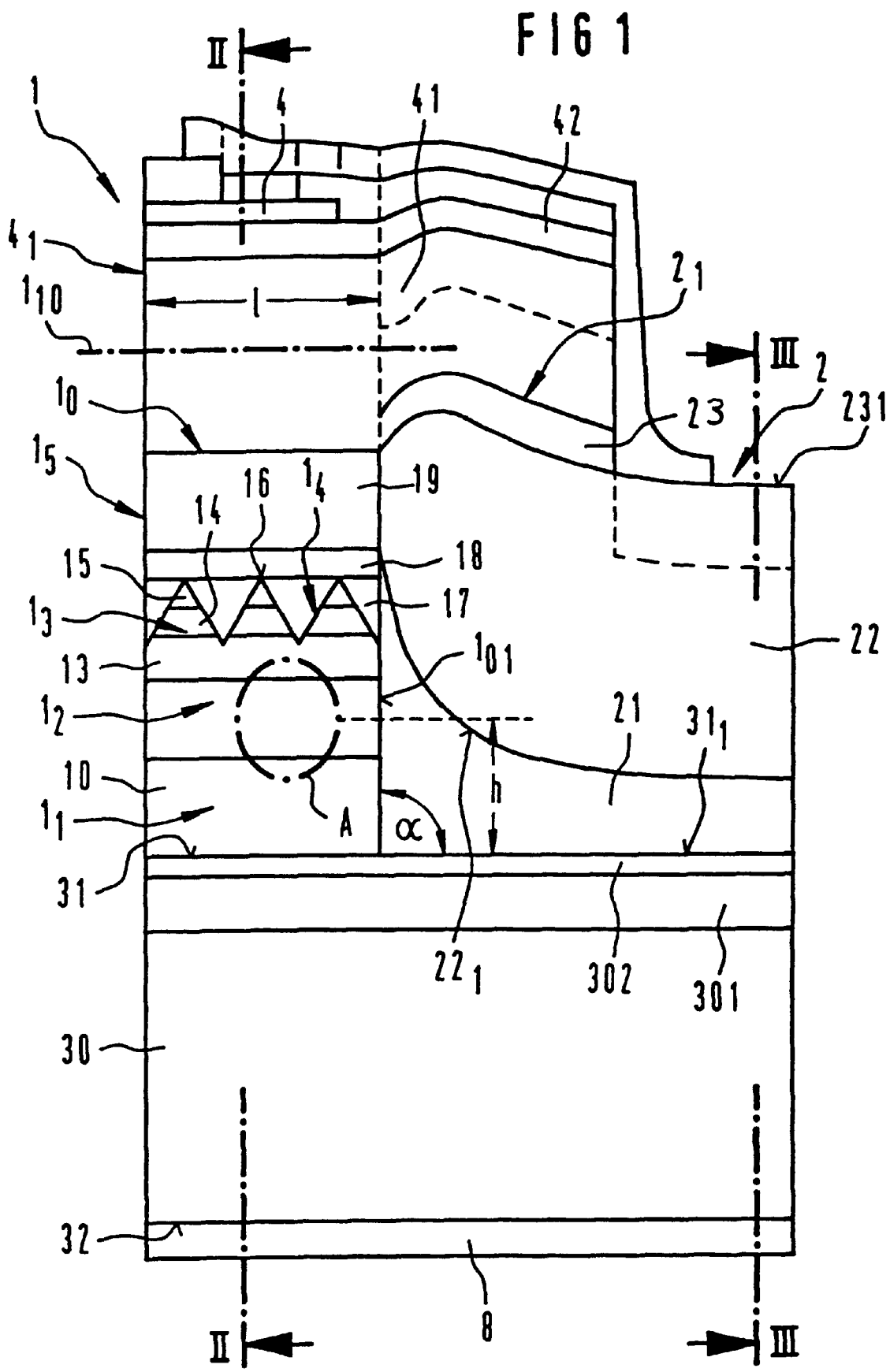
FIG. 1 shows a longitudinal-axial section through a DFB laser diode according to the invention and an optical waveguide which is coupled thereto, this section corresponding to a section on the section line I—I in FIG. 2.

An optical grating $1_4$ is produced in the form of a relief in the surface 16 of the second layer stack $1_3$, for example a grating $1_4$ made of parallel-running grating grooves each having a triangular profile, whose longitudinal axis is at right angles to the plane of the drawing in FIG. 1.

In a second epitaxial step, a third layer stack $1_5$, which is composed of one or more layers 17, 18, 19 made of semiconductor material of the opposite conductance type p and covers the grating $1_4$, is produced on the surface 16 of the second layer stack $1_3$.

The second layer stack $1_3$, the laser-active layer $1_2$ and the first layer stack $1_1$ are removed in areas down to the surface 31 of the substrate 30 so that a raised region $1_0$ which is composed of the first layer stack $1_1$, the laser-active layer $1_2$ and the second layer stack $1_3$ and has an end surface $1_{01}$ at an angle α, which is preferably approximately 90°, to the surface 31 of the substrate 30, remains on this surface 31, and a region $31_1$, which bounds the end surface $1_{01}$ of said raised region $1_0$, of the surface 31 of the substrate 30 is exposed alongside this raised region $1_0$.

In a third epitaxial step, a fourth layer stack $2_1$, which is produced on the exposed region $31_1$ of the surface 31 of the substrate 30 but not on the raised region $1_0$, which fourth layer stack $2_1$ defines the optical waveguide 2 and is composed of a first and a second optical outer layer 21, 23 and an optically conductive layer 22 located between these outer layers 21, 23, the optically conductive layer 22 being at the level h of the laser-active layer $1_2$ with respect to the surface 31 of the substrate 30 at the level h of the laser-active layer $1_2$ and having an end surface $22_1$ which is opposite the end surface $1_{01}$ of the raised region $1_0$.

In a fourth epitaxial step,, a fifth layer stack $4_1$, which is composed of at least one layer 41 made of semiconductor material of the opposite conductance type p and of a contact layer 42 for the fitment of a preferably metal electrical contact 4, on the raised region $1_0$ and on the fourth layer stack $2_1$.

These are the essential method steps of the method according to the invention for producing a DFB laser diode and an optical waveguide which is optically coupled to the laser diode.

Two depressions 61, 62 are advantageously produced in the remaining raised region $1_0$ which depressions 61, 62 extend as far as the vicinity of the grating $1_4$ to the depth t are separated from one another by a ridge $1_{00}$ made of layers 19, 41, 42, which remain between the depressions 61, 62 above the grating $1_4$, of the raised region $1_0$ and with a longitudinal axis $1_{10}$ which is essentially at right angles to the end surface $1_{01}$ of the raised region $1_0$, and extend as far as the vicinity of this end surface $1_{01}$. The width b of the rib $1_{00}$ defines the width of the laser diode, that is to say the region in which the laser light is produced in the laser-active layer $1_2$ and is emitted from this layer $1_2$, through the end surface $1_{01}$ of the raised region $1_0$, into the waveguide 2.

The waveguide 2 which is optically coupled to the end surface $1_{01}$ of the raised region $1_0$ is a film waveguide. In order to produce optical directional couplers and other waveguide structures, for example filters, modulators, switches or the like which require strip-type waveguides, the layers 23, 41, 42 which are located above the optically conductive layer 22 of the waveguide 2 are advantageously removed in the fourth layer stack $2_1$ after the fourth epitaxial step, and a structure made of ridges $22_2$ is produced in the exposed surface 231 of this optically conductive layer 22, each ridge $22_2$ defining a ridge waveguide which is a strip-like waveguide. Two ridges $22_2$ which run parallel in sections, can, for example, define an optical directional coupler.

During the selective third epitaxial step, the procedure is expediently such that the raised region $1_0$ is covered with a passivation layer which leaves its end surface $1_{01}$ exposed, is not illustrated and on which no material grows during the third epitaxial step. The passivation layer is removed after the third epitaxial step and before the fourth epitaxial step.

The laser-active layer $1_2$ has two or more, preferably up to eight, compressively strained quantum well layers 11 which define quantum wells and are made of quaternary material with intermediate barrier layers made of quaternary material (see B. Stegmüller, E. Veuhoff, J. Rieger and H. Hedrich "High-Temperature (130° C.) CW operation of 1.53 μm InGaAsP ridge-waveguide lasers using strained quaternary quantum wells", Electronics Letter, Vol. 29(1993), No. 19, pages 1691–1693). In order to achieve high optical power in the region of this laser-active layer, the quantum well layers 11 and barrier layers 12 are arranged between two layers 100, 101 made of a quaternary material having a gap wavelength which is lower than the quantum well layers 11. In the example according to FIG. 4, a layer 104 or 103, respectively, made of quaternary material and having the same gap wavelength as the quantum well layers 11 is in each case arranged between the quantum well layers 11 and the barriers layers 12 and each layer 100 and 101 having a lower gap wavelength.

The depressions 61, 62 which define the ridge $1_{00}$ and whose width and length are located completely within the raised region $1_0$ can be produced with high accuracy if a third layer stack $1_5$, which has an etch-stop layer 18 covering the grating $1_4$, is produced in the second epitaxial step. This etch-stop layer 18 must be made of a material which is not attacked, or is relatively weakly attacked, by an etching agent which attacks the layer 19 located above this etch-stop layer 18.

The ridge $1_{00}$ and adjacent regions are covered with an insulating dielectric 6 in which a contact window 40 is opened on the ridge $1_{00}$. The contact 4, which is connected to contact lines 7, is fitted in this contact window 40 to the contact layer 42.

It is expedient to increase the conductivity in the contact layer 42 and/or the layer 41 underneath it, for example by increasing the doping there, using a suitable dopant.

It is also expedient if a substrate 30 is used whose surface 31 is defined by an etch-stop layer 302 which is applied on a buffer layer 301 of the substrate 30. The material of this etch-stop layer 302 must be selected such that it is not attacked, or is attacked only relatively weakly, by an etching agent which attacks the layer 10 located above it.

The rear surface 32 of the substrate 30, facing away from the surface 31, is provided with a rear contact 8.

In the case of the example described so far, the specific one conductance type corresponds to n-doping and the opposite conductance type to p-doping. They could also be reversed.

In the case of a specific implementation of the exemplary embodiment, which forms an MCRW-DFB high-temperature laser diode 1 having a coupled waveguide 2, the substrate 30 is composed of $n^+$-doped InP, the buffer layer 301 is composed of n-doped InP and is 1.5 $\mu$m thick, the etch-stop layer 302 is composed of n-doped quaternary InGaAsP having a gap wavelength of 1.05 $\mu$m and a thickness of only 0.05 $\mu$m. The first layer stack $1_1$ is composed of a single layer 10 made of n-doped InP and having a thickness of 0.4 $\mu$m.

The laser-active layer $1_2$ has, for example, five quantum well layers 11 made of quaternary material having a gap wavelength of 1.1 $\mu$m, which are separated from one another by barrier layers 12 made of quaternary material and having a gap wavelength of 1.25 $\mu$m. The layers 103 and 104 are composed of quaternary material having a gap wavelength of 1.1 mm, and the layers 100 and 101 are composed of quaternary material having a gap wavelength of 1.05 $\mu$m. The layers 101 and 102 in each case together form so-called separate confinement heterostructure layers (SCH layers), in the same way as the layers 101 and 103. Overall, the thickness of the laser-active layer $1_2$ is approximately 0.28 $\mu$m.

The second layer stack $1_3$ is composed of a p-doped layer which is applied directly on the laser-active layer $1_2$ and is made of InP, a p-doped layer 14 which is applied on this layer 13 and is made of quaternary material having a gap wavelength of 1.05 $\mu$m, and a p-doped layer 15 which is applied on this layer 14 and is made of InP or InGaAs. Four layers could also be used instead of three layers. The layer 14 which is covered by the layer 15 and is made of quaternary material has the advantage that the optical grating $1_4$ which is produced in this second layer stack $1_3$ has a coupling constant which is independent of the etching depth of the grating grooves.

The third layer stack $1_5$, which is produced during the second epitaxial step, is composed of the p-doped layer 17 which is applied directly on the grating $1_4$ and is made of InP, of the p-doped etch-stop layer 18 which is applied on this layer 17 and is made of quaternary material having a gap wavelength of 1.05 $\mu$m, and of a p-doped layer 19 which is applied on this layer 18 and is made of InP.

The raised region $1_0$ having a width $b_1$ of approximately 20 $\mu$m and a length l, which extends as far as its end surface $1_{01}$, of approximately 400 $\mu$m, is subsequently etched as far as the etch-stop layer 302 by combined dry and wet etching.

The passivation layer which is used in the production of the waveguide 2 is composed of $SiO_2$. The two outer layers 21 and 23 of the waveguide 2 are composed of InP, and the optically conductive layer 22 is composed of quaternary material having a gap wavelength of 1.05 $\mu$m. The thickness of the optically conductive layer 22 is, for example, approximately 0.64 $\mu$m, and the ridges $22_2$ which are formed in its surface 231 have a height of 0.2 $\mu$m and a width of 1.3 $\mu$m.

The fifth layer stack $4_1$, which is produced during the fourth epitaxial process over the whole area, is composed of a p-doped layer 41 which is applied on the third layer stack $1_5$ and the fourth layer stack $2_1$ and is made of InP, and of the contact layer 42 which is applied on this layer 41 and is made of p-doped InGaAs. Zn can be used to increase the p-doping in these layers 41 and 42.

The arrangement according to FIG. 5 is an integrated MCRW laser diode 1 produced in accordance with the method according to the invention and having a coupled waveguide 2 as has been described comprehensively in the above text in conjunction with FIGS. 1 to 4. This arrangement additionally has a monitoring diode 3, which has the same structure as the laser diode 1. The laser diode 1 and the monitoring diode 3 are created by producing a separating trench 63 in the remaining raised region $1_0$, which separating trench 63 extends essentially parallel to the end surface $1_{01}$ of the raised region $1_0$ and as far as the surface 31 of the substrate 30 to the depth T and divides the raised region $1_0$ into two parts $1_{02}$ and $1_{03}$ which are separated from one another. The path $1_{02}$ defines the laser diode 1, and the part $1_{03}$ the monitoring diode 3.

The double-T-shape of the laser diode 1 and the monitoring diode 3, which results from the etching of the two depressions 61 and 62 to the right and left alongside the respective ridge $1_{00}$ which is covered by an electrical line 7, and their electrical decoupling by the deep separating trenches 63 can be clearly seen.

The etching to produce this separating trench 63 at the same time serves to form proud blocks 80 for bonding pads, as a result of which the electrically connected pn-areas and the leakage currents are reduced in magnitude.

Figure 7:
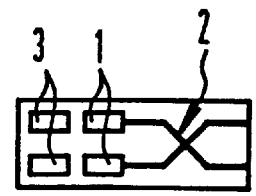
FIG. 7 shows a greatly simplified schematic illustration of a first chip form comprising laser diodes with coupled waveguides and photodiodes.

FIG. 7 shows an arrangement in which two laser diodes 1 are coupled by means of a coupled monitoring diode 3 in each case to an optical directional coupler made of ridged waveguides 2.

Figure 8:
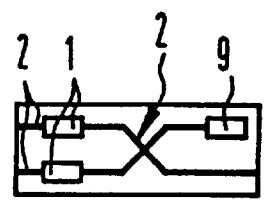
FIG. 8 shows a greatly simplified schematic illustration of a second chip form, comprising laser diodes with coupled waveguides and photodiodes.

FIG. 8 shows an arrangement in which two ridged waveguides 2 on one side, and a directional coupler made of ridged waveguides 2 on the other side are coupled to two laser diodes 1, one branch of the directional coupler leading to a separate monitoring diode 9.

We claim:

1. A method for producing an arrangement composed of a MCRW-DFB laser diode and an optical waveguide, which is optically coupled to the laser diode, comprising the steps of:

producing on a surface of a substrate of $n^+$-doped InP in
a first epitaxial step
a buffer layer of n-doped InP on the surface of the substrate,
a first etch stop layer of quaternary material on the buffer layer,
a first layer stack which is composed of at least one layer made of n-doped InP on the first etch stop layer,
a laser-active layer which is composed of at least two compressively strained quantum well layers made of a quaternary material and of at least one barrier located between the quantum well layers and made of a quaternary material, on the first layer stack and
a second layer stack on the laser-active layer, said second layer stack being at least composed of a first layer of p-doped InP arranged on the laser-active layer, of a second layer of p-doped quaternary material arranged on the first layer, and of a third layer of p-doped InP arranged on the second layer and having a surface facing away from the laser-active layer,
an optical grating that is a relief in the surface of the second layer stack,
producing in a second epitaxial step
a third layer stack on the surface of the second layer stack containing the grating, said third layer stack being composed of a fourth layer of one of p-doped InP or ternary material that covers the grating, of a second etch stop layer of p-doped quaternary material arranged on the fourth layer and of a fifth layer of p-doped InP arranged on the fourth layer, the second layer stack, the laser-active layer and the first layer stack being removed in areas down to the first etch stop layer, so that a raised region which is composed of the first layer stack, the laser-active layer and the second layer stack and has an end face at an angle to the first etch stop layer remains on the first etch stop layer, and a region of the first etch stop layer that adjoins the end face of said raised region being uncovered alongside this raised region, producing in a third epitaxial step a fourth layer stack which is produced selectively on the exposed region of the first etch stop layer but not on the raised region, which fourth layer stack defines the waveguide and is composed of a first optical outer layer and a second optical outer layer and an optically conductive layer of quaternary material located between the first and second outer layers, whereby the optically conductive layer lies at a level of the laser-active layer with respect to the first etch stop layer and has an end face lying opposite the end face of the raised region, and producing in a fourth epitaxial step a fifth layer stack on the raised region and the fourth layer stack, said fifth layer stack being composed of a sixth layer of p-doped InP and of a contact layer of p-doped InGaAs arranged on the sixth layer for application of an electrical contact.

2. The method according to claim 1, wherein two depressions are produced in the remaining raised region, which depressions extend in depth as far as the second etch stop layer, are separated from one another by a ridge that is composed of the fifth layer, the sixth layer and the contact layer of the raised region that remain between the depressions above the second etch stop layer and that have a longitudinal axis that is substantially perpendicular to the end face of the raised region, and extend into a vicinity of the end face of the raised region.

3. The method according to claim 1, wherein a separating trench is produced in the remaining raised region, which separating trench extends substantially parallel to the end face of said raised region and extends in depth to the first etch stop layer and divides the raised region into two parts which are separated from one another.

4. The method according to claim 1, wherein the second optical layer, the sixth layer and the contact layer, which are located above the optically conductive layer, are removed in the fourth layer stack, and at least one ridge is produced in an exposed surface of the optically conductive layer.

5. The method according to claim 1, wherein a laser-active layer is produced, the laser-active layer having quantum well layers and barrier layers arranged at least between two layers of a quaternary material having a lower gap wavelength compared to the quantum well layers.

6. The method according to claim 1, wherein a second stack layer is produced on the laser-active layer, whereby a further layer of one of p-doped InP or of ternary material is arranged on the third layer of one of p-doped InP or of ternary material arranged on the second layer of p-doped quaternary material, that surface of said further layer facing away from the laser-active layer forming the surface of the second layer stack.

7. An arrangement of an MCRW-DFB high-temperature laser diode and an optical waveguide optically coupled to the laser diode, comprising:

a buffer layer of n-doped InP and, on said buffer layer, a first etch stop layer of n-doped quaternary material on the buffer layer;

a raised, first layer sequence provided for the laser diode and a second layer sequence provided for the waveguide, said first and second layer sequences being arranged next to one another, on the first etch stop layer, the first layer sequence being at least composed of an initial layer of n-doped InP, a laser-active layer arranged on the initial layer and having at least two compressively strained quantum well layers of quaternary material and at least one barrier layer of a quaternary material that lie between the quantum well layers, a first layer of p-doped InP arranged on the laser-active layer, a second layer of p-doped quaternary material arranged on the first layer, a third layer of one of p-doped InP or ternary material arranged on the second layer and having a surface facing away from the laser-active layer, an optical grating being fashioned as a relief in said surface, a fourth layer of p-doped InP covering the grating, a second etch stop layer of p-doped quaternary material arranged on the fourth layer, and a fifth layer of p-doped InP arranged on the fourth layer, and the second layer sequence is composed of a first optical cladding layer and second optical cladding layer of InP, a waveguiding layer of quaternary material lying between the first and second cladding layers, the laser-active layer and the waveguiding layer being at a common height and adjoining one another in end faces lying opposite one another that reside at an angle relative to the first etch stop layer, and a sixth layer of p-doped InP and a contact layer of p-doped InGaAs arranged on the sixth layer for application of an electrical contact, on the two raised layer sequences.

8. The arrangement according to claim 7, wherein two depressions, extending in depth to the second etch stop layer, are located in a region of the first layer sequence, said depressions being separated from one another by a ridge that is composed of the fifth layer, the sixth layer and the contact layer over the second etch stop layer that have remained between the depressions and that have an axis substantially perpendicular to the end face of the laser-active layer, and said depressions extending into a proximity of the end face of the laser-active layer.

9. The arrangement according to claim 7, wherein a parting trench that extends substantially parallel to the end face of the laser-active layer and extends in depth to the first etch stop layer is located in a region of the first layer sequence, said parting trench dividing the first layer sequence and the sixth and contact layers situated thereon into two parts separated from one another.

10. The arrangement according to claim 7, wherein the layers located above the waveguiding layer, are removed in the fourth layer stack and at least one ridge is located in an uncovered surface of the waveguiding layer.

11. The arrangement according to claim 7, wherein the laser-active layer has quantum well layers and barrier layers arranged at least between two layers of a quaternary material having a lower gap wavelength compared to the quantum well layers.

12. The arrangement according to claim 7, wherein a further layer of one of p-doped InP or ternary material is located in the first layer sequence on the third layer of p-doped InP of ternary material arranged on the second layer of p-doped quaternary material above the laser-active layer, said further layer comprising a surface that faces away from the laser-active layer and in which the optical grating is located in a form of a relief.

* * * * *